(12) United States Patent
Chakravarty et al.

(10) Patent No.: US 7,325,208 B2
(45) Date of Patent: Jan. 29, 2008

(54) METHOD, APPARATUS AND SYSTEM FOR INDUCTANCE MODELING IN AN ELECTRICAL CONFIGURATION

(75) Inventors: Sourav Chakravarty, Hillsboro, OR (US); Yaakov Ben-Noon, Herzlia (IL); Eli Chiprout, Tempe, AZ (US); Mohiuddin Mazumder, San Jose, CA (US); Dmitry Messerman, Haifa (IL)

(73) Assignee: Intel Corporation, Santa Clara, CA (US)

( * ) Notice: Subject to any disclaimer, the term of this patent is extended or adjusted under 35 U.S.C. 154(b) by 490 days.

(21) Appl. No.: 10/950,676

(22) Filed: Sep. 28, 2004

(65) Prior Publication Data

US 2006/0074617 A1 Apr. 6, 2006

(51) Int. Cl.
G06F 17/50 (2006.01)
(52) U.S. Cl. .............................. 716/5; 716/4
(58) Field of Classification Search ............ 716/5, 716/6, 4; 703/4, 13
See application file for complete search history.

(56) References Cited

U.S. PATENT DOCUMENTS

| | | | | |
|---|---|---|---|---|
| 6,718,530 | B2 * | 4/2004 | Kim et al. ................. | 716/6 |
| 2004/0075436 | A1 * | 4/2004 | Kurokawa et al. ......... | 324/318 |
| 2005/0120316 | A1 * | 6/2005 | Suaya et al. ............... | 716/4 |

OTHER PUBLICATIONS

Chang et al., "Accurate and Efficient Inductance Extraction for SOC Noise and Signal Integrity," IEEE, 2002, pp. 209-213.*
Bhaduri et al., "Parasitic-Aware Synthesis of Re LNA Circuits Considering Quasi-Static Extraction of Inductors and Interconnects," IEEE, 2004, pp. I-477-480.*
Kurokawa et al., "Approximiate Formula Approach for Efficient Inductance Extraction," IEEE, 2003, pp. 143-148.*
Fan et al., "Lumped-Circuit Model Extraction for Vias in Multilayer Structures," IEEE, 2003, pp. 272-280.*
"Fasthenry: A Multipole-Accelerated 3D Inductance Extraction Program", Kamon, Matton; Tsuk, Michael J.;White Jacob K.: IEEE Trans. Microwave Theory and Tech. vol. 42, No. 0, Sep. 1994, pp. 1750-1758.
"Wave Propagation Parametres for Wireless Ground System", Messerman D.G., Perelman L.S. ; Izv. An USSR Engergetika I Transport. 1986. No. 1, pp. 65, 71-74.
"Full-Chip, three-dimensional, shapes-based RLC extraction", K.L. Shepard, D. Sitaram, and Yu Zheng: International Conference on Computer Aided Design, Proceedings of the 2000 IEEE/ACM International conference on Computer-aided design, San Jose, California, Session 3D: inductance and full-wave analysis, pp. 142-149, Year of Publication: 2000 ISBN:0-7803-6448-1.
Cletus Hoer and Carl Love, "Exact Inductance Equations for Rectangular Conductors with Applications for more Complicated Geometries", Journal of Research of the National Bureau of Standards-C, Engineering and Instrumentation, vol. 69C, No. 2, Apr.-Jun. 1965, pp. 131-132.

* cited by examiner

Primary Examiner—Vuthe Siek
(74) Attorney, Agent, or Firm—Pearl, Cohen, Zedek, Latzer, LLP

(57) ABSTRACT

Embodiments of the present invention provide a method, apparatus and system for inductance modeling. According to some exemplary embodiments, a method for inductance modeling may include determining a plurality of two-dimensional mutual inductance values corresponding to a designated victim within a geometrical event and a plurality of designated attackers, respectively. Other embodiments are described and claimed.

31 Claims, 6 Drawing Sheets

METHOD, APPARATUS AND SYSTEM FOR INDUCTANCE MODELING IN AN ELECTRICAL CONFIGURATION

BACKGROUND OF THE INVENTION

Conventional modeling techniques have been implemented for determining parasitic resistances and capacitances within an electrical circuit layout. However, parasitic inductances between interconnect lines within the circuit have been largely ignored.

As the operational frequencies of electrical circuits increases, inductive coupling between the interconnect lines within a circuit may affect the timing and/or noise analysis of the circuit.

Thus, a need exists for accurately and/or efficiently determining the parasitic inductances within an electrical circuit layout.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
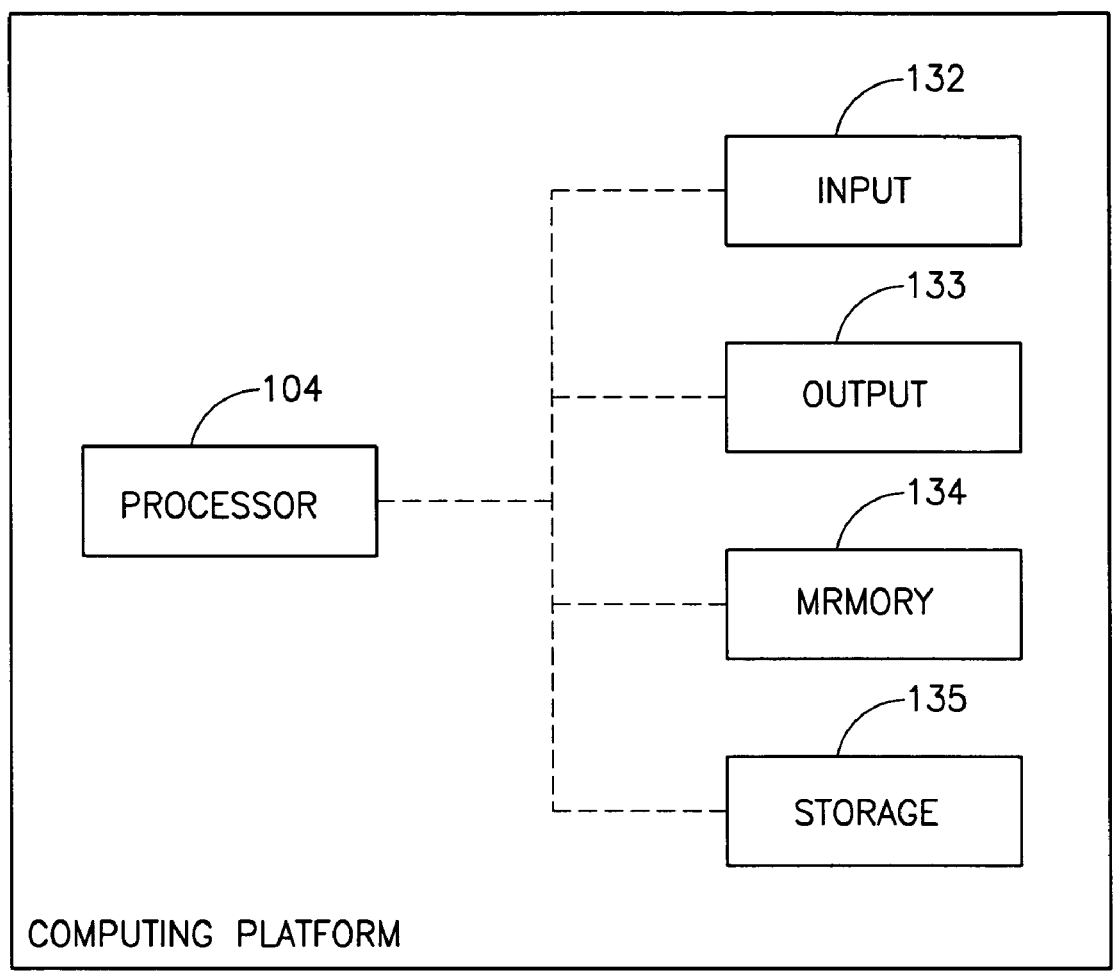
FIG. 1 is a schematic illustration of a computing platform in accordance with some exemplary embodiments of the present invention.
Figure 1:

It will be appreciated that for simplicity and clarity of illustration, elements shown in the drawings have not necessarily been drawn accurately or to scale. For example, the dimensions of some of the elements may be exaggerated relative to other elements for clarity or several physical components included in one functional block or element. Further, where considered appropriate, reference numerals may be repeated among the drawings to indicate corresponding or analogous elements. Moreover, some of the blocks depicted in the drawings may be combined into a single function.

DETAILED DESCRIPTION OF EMBODIMENTS OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits may not have been described in detail so as not to obscure the present invention.

Some portions of the following detailed are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices. In addition, the term "plurality" may be used throughout the specification to describe two or more components, devices, elements, parameters and the like.

Embodiments of the present invention may include apparatuses for performing the operations herein. These apparatuses may be specially constructed for the desired purposes, or they may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), electrically programmable read-only memories (EPROMs), electrically erasable and programmable read only memories (EEPROMs), magnetic or optical cards, a Dynamic RAM (DRAM), a Synchronous DRAM (SD-RAM), a Flash memory, a volatile memory, a non-volatile memory, a cache memory, a buffer, a short term memory unit, a long term memory unit, or any other type of media suitable for storing electronic instructions, and capable of being coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein.

Reference is made to FIG. 1, which schematically illustrates a computing platform 100 in accordance with some exemplary embodiments of the invention.

According to the exemplary embodiments of FIG. 1, computing platform 100 may include a processor 104, an input unit 132, an output unit 133, a memory unit 134, and/or a storage unit 135. Computing platform 100 may additionally or alternatively include other suitable hardware components and/or software components.

Processor 104 may include, for example, a Central Processing Unit (CPU), a Digital Signal Processor (DSP), a microprocessor, a host processor, a plurality of processors, a controller, a chip, a microchip, or any other suitable multipurpose or specific processor or controller. Input unit 132 may include, for example, a keyboard, a mouse, a touch-pad, or other suitable pointing device or input device. Output unit 133 may include, for example, a Cathode Ray Tube (CRT) monitor, a Liquid Crystal Display (LCD) monitor, or other suitable monitor or display unit. Storage unit 135 may include, for example, a hard disk drive, a floppy disk drive, a Compact Disk (CD) drive, a CD-Recordable (CD-R) drive, or other suitable removable and/or fixed storage unit. Memory unit 134 may include, for example, a RAM, a ROM, a DRAM, a SD-RAM, a Flash memory, a volatile memory, a non-volatile memory, a cache memory, a buffer, a short term memory unit, a long term memory unit, or other suitable memory units or storage units.

According to some exemplary embodiments of the invention, memory and/or storage unit 135 may store one or more instructions readable by processor 104, that when executed by processor 104 may result in determining a plurality of two-dimensional mutual inductance values corresponding to a designated "victim segment" within a geometrical event of an electric configuration, and a plurality of designated "attacker segments", respectively, e.g., separately, as described in detail below.

It will be appreciated that the term "victim segment" as used herein may refer to an interconnect segment, portion, section, fragment, piece, part, and/or element which is determined, designated, and/or selected from one or more interconnect segments of an electric configuration; and the term "attacker segment" as used herein may refer to another interconnect segment, portion, section, fragment, piece, part, and/or element which is determined designated, and/or selected from one or more other interconnect segments of the electric configuration, e.g., for determining a self inductance of the victim segment and/or a mutual inductance value corresponding to the victim and attacker segments.

An electric configuration, e.g., a multi-layer circuit, may include a plurality of interconnects. The electric configuration may include signal lines ("nets"), for example, associating a plurality of electric units, e.g., transistors and/or any other suitable electric units as are known in the art. The electric configuration may also include a plurality of power lines ("returns"), e.g., for providing power to at least some of the electric units. The signal lines and power lines may be arranged in a plurality of layers, for example, such that one or more layers include power and/or signal lines which are substantially parallel to each other, and the power and/or signal lines of one or more layers are substantially orthogonal to the power and/or signal lines of succeeding layers. For example, an electric configuration may include first and third layers having power and signal lines oriented in a horizontal direction, and second and fourth layers having power and signal lines oriented in a vertical direction. Some of the signal lines may have one or more portions perpendicular to the layers, e.g., such that such signal lines may propagate through two or more of the layers.

Reference is also made to FIGS. 2, 3, 4, 5, and 6 which conceptually illustrate five layers 200, 300, 400, 500 and 600, denoted, M9, M7, M5, M8 and M6, respectively, of an electrical circuit layout in accordance with some exemplary embodiments of the invention.

According to exemplary embodiments of the invention, layers M5, M6, M7, M8 and M9 are successive layers, e.g., layer M9 may be directly above layer M8, layer M8 may be directly above layer M7, and so on. Layers M5, M7 and M9 may include one or more interconnects oriented in a first direction, e.g., an "x" direction of a Cartesian coordinate system, and layers M6 and M8 may include one or more interconnects oriented in a second direction orthogonal to the first direction, e.g., a "y" direction of the Cartesian coordinate system.

Layer M9 may include for example, signal lines 220, 222, 226 and 228; and power lines 224 and 230. Layer M7 may include, for example, signal lines 320, 322, 326 and 328; and power lines 324 and 330. Layer M5 may include for example, signal lines 420, 422, 426 and 428; and power lines 424 and 430. Layer M8 may include for example, signal lines 522, 526, 528, and 530; and power lines 524 and 532. Layer M6 may include for example, signal lines 622, 626, and 630; and power lines 624 and 632. The electrical circuit layout may also include one or more other layers in addition to layers M5, M6, M7, M8 and M9. One or more particular layers of the electrical circuit layout may be specified, for example, by a user control file, e.g., as described below.

It will be appreciated by those skilled in the art, that the illustrations of metallization patterns in FIGS. 2, 3, 4, 5 and 6 are simplified depictions to facilitate understanding of some aspects of the invention. Generally, the layers of an electrical circuit, e.g., a digital circuit, may include patterns that are more complex than those illustrated in FIGS. 2-6. In addition, although the power and/or signal lines in FIGS. 2, 3, 4, 5 and 6 are shown to be substantially one-dimensional for simplicity of illustration, it should be appreciated that such power and/or signal lines may have at least one other significant dimension, e.g., a non-zero line width.

Figure 7:
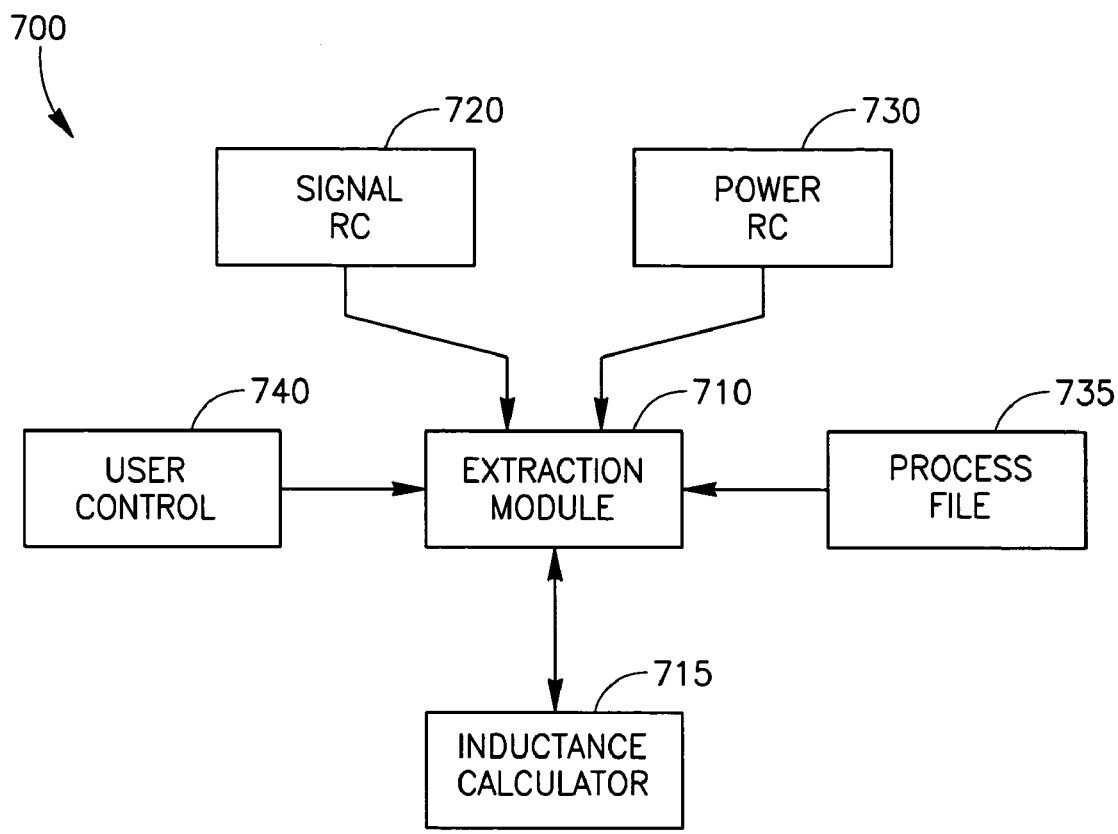
FIG. 7 is a conceptual illustration of an inductance modeling arrangement, which may be implemented, for example, by the computing platform of FIG. 1, in accordance with some exemplary embodiments of the invention.

Reference is made to FIG. 7, which conceptually illustrates an inductance modeling arrangement 700 for determining the parasitic inductance of an electrical circuit layout in accordance with some exemplary embodiments of the invention.

Figure 6:

Although the invention is not limited by this respect, arrangement 700 may be implemented for determining the parasitic inductance of an electrical circuit layout including one or more of layers 200 (FIG. 2), 300 (FIG. 3), 400 (FIG. 4), 500 (FIG. 5) and 600 (FIG. 6).

According to exemplary embodiments of the invention, arrangement 700 may determine the parasitic inductance of the electrical circuit layout by performing "pair based" extraction, which may include determining a plurality of two-dimensional mutual inductance values corresponding to a designated victim segment and a plurality of designated attacker segments, respectively, e.g., separately, as described below.

According to exemplary embodiments of the invention, arrangement 700 may include an extraction module 710 able to receive data from a signal resistance-capacitance (RC) database 720, a power RC database 730, a process file 735, and/or a user control file 740, as described below. Arrangement 700 may also include a two-dimensional inductance calculator 715 to calculate a two-dimensional mutual inductance value corresponding to a designated victim signal segment and a designated attacker signal segment, as described below.

Database 720 may include, for example, data relating to the layout of signal lines of the electrical circuit layout. For example, database 720 may include values of resistances, capacitances, line widths, and associated position coordinates of the signal lines. For example, database 720 may be implemented in a spef format, an ntcl format or any other suitable format known in the art. Other circuit description data formats and/or techniques, e.g., as are known in the art, may be additionally or alternatively used.

Database 730 may include, for example, data relating to the layout of power lines, e.g., Vcc and/or Vss lines, of the electrical circuit layout. For example, database 730 may include values of resistances, capacitances, line widths, and associated position coordinates of the power lines. For example, database 730 may be implemented in a spef format, an ntcl format or any other suitable format known in the art. Other circuit description data formats and/or techniques, e.g., as are known in the art, may be additionally or alternatively used.

Process file 735 may include, for example, information related to the processes used in the electrical circuit layout. For example, process file 735 may include metallization thickness information, metallization resistivity information, dielectric thickness information, dielectric permittivity information, number of layers in the electrical circuit layout, and/or any other suitable process information.

User control file 740 may include, for example, user-specified control parameters. User control file 740 may include information such as, for example, one or more specific layers of the electrical circuit layout to be analyzed, the number of layers to be analyzed, the size of an interaction window to be used during the modeling, and/or any additional and/or alternative suitable type of information. According to some exemplary embodiments, a user interface, e.g., as is known in the art, may be implemented to directly query the user for control information.

Aspects of the invention are described herein in the context of an inductance modeling arrangement, e.g., arrangement 700, including a signal RC database, a power RC database, a process file, and/or a user control file implemented as separate data structures. However, it will be appreciated by those skilled in the art that, according to other embodiments of the invention, that two or more of the signal RC database, the power RC database, the process file, and/or the user control file may be combined into a single data structure.

According to some exemplary embodiments of the invention, module 710 may be able to analyze the electrical circuit layout, e.g., using the data of databases 720 and/or 730, and/or the data of files 735 and/or 740, as described below.

According to some exemplary embodiments, module 710 may be able to "break down" the electrical circuit layout into a plurality of "inductance pairs" to be analyzed, e.g., separately and/or independently, by calculator 715. For example, module 710 may be able to divide at least part of the electrical circuit layout into a plurality of geometrical events, and designate one or more victim segments and/or attacker segments within one or more of the geometrical events, as described below. Module 710 may also be able to selectively provide calculator 715 with data relating to a designated victim segment and a designated attacker segment, e.g., within a currently evaluated geometrical event, as described below. Calculator 715 may be adapted to determine the mutual inductance value corresponding to the designated victim segment and the designated attacker segment, as described below. Calculator 715 may also be able to determine the self-inductance of the designated victim segment. Module 710 may further be able to combine ("stitch") the determined self-inductances and/or mutual inductances, e.g., to generate resistance-inductance-capacitance (RLC) data corresponding to the analyzed electrical circuit layout, as described below. The RLC data may be stored, for example, in storage 135 (FIG. 1), and/or may be provided to output 133 (FIG. 1).

Although the invention is not limited in this respect, inductance-modeling arrangement 700 may be implemented by a computing platform, e.g., computing platform 100 (FIG. 1). For example, module 710 and/or inductance calculator 715 may be implemented by instructions stored in memory 134 (FIG. 1) and executable by processor 104 (FIG. 1). Databases 720, 730 and/or 740 may be stored in storage 135 (FIG. 1) and/or maybe received from an external storage (not shown) e.g., via input 132 (FIG. 1).

Figure 8:
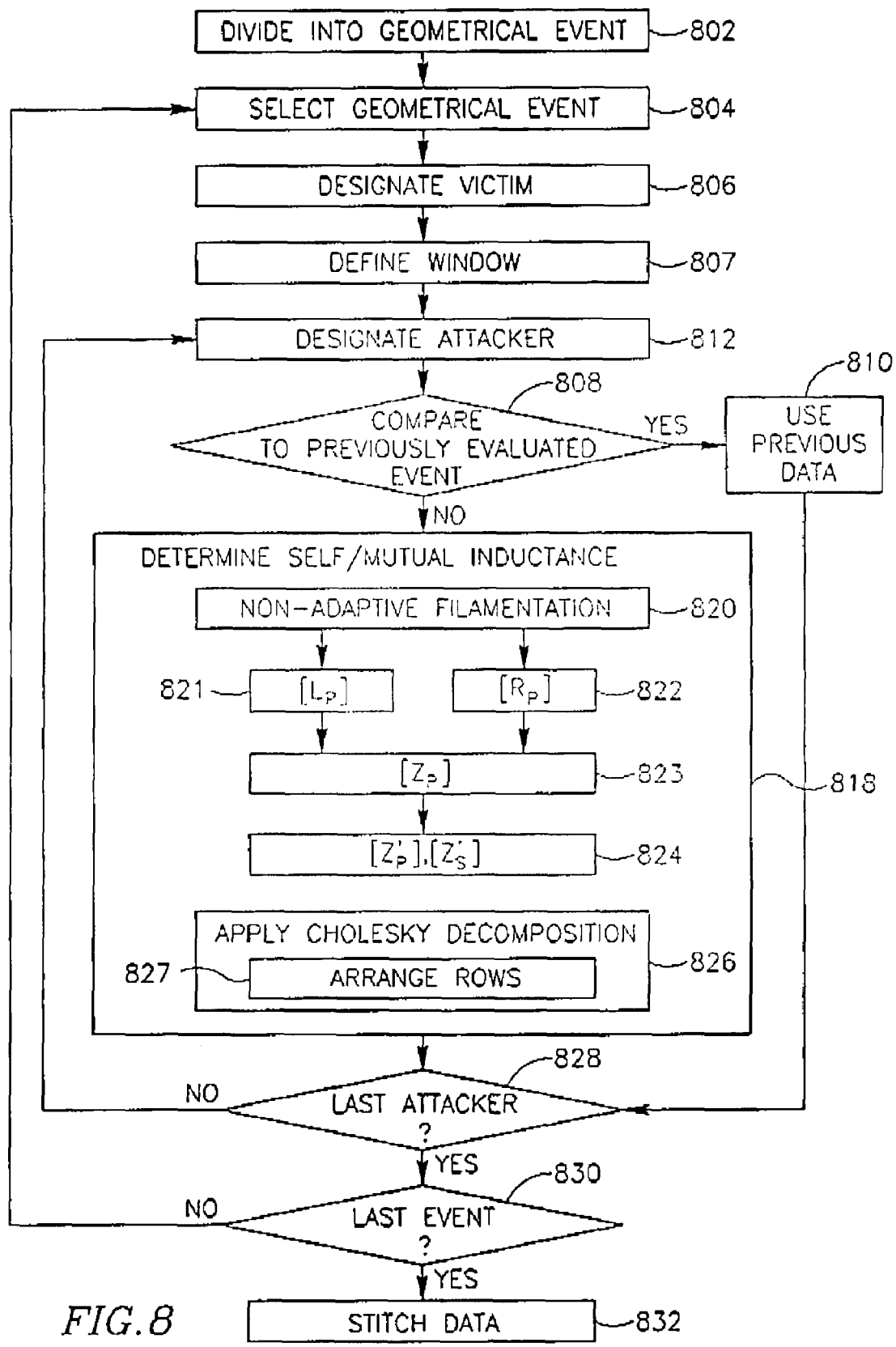
FIG. 8 is a schematic illustration of a method of inductance modeling according to some exemplary embodiments of the invention.

Reference is made to FIG. 8, which schematically illustrates a method of inductance modeling according to some exemplary embodiments of the invention.

Although the invention is not limited in this respect, the method of inductance modeling according to exemplary embodiments of the invention may be implemented by inductance modeling arrangement 700 (FIG. 7) for performing an inductance modeling of an electrical circuit layout, for example, including one or more of layers 200 (FIG. 2), 300 (FIG. 3), 400 (FIG. 4), 500 (FIG. 5) and 600 (FIG. 6), e.g., as described below.

As indicated at block 802, according to some exemplary embodiments the method may include dividing the electrical circuit layout into a plurality of geometrical events. One or more of the geometrical events may include, for example, one or more layers, e.g., three layers, having a substantially uniform signal and power configuration in a predetermined direction, as described below.

Information related to the electrical circuit layout may be received, for example, from signal RC database 720, power RC database 730, and/or process file 735 (FIG. 7).

Referring back to FIGS. 2-7, according to some exemplary embodiments of the invention, module 710 (FIG. 7) may scan the circuit layout layers M5, M6, M7, M8 and M9 in the x and/or y directions, e.g., separately and/or independently. When scanning in the x-direction, module 710 may consider, for example, layers M5, M7 and M9, and when scanning in the y-direction, module 710 may consider, for example, layers M6 and M8. These scans may be performed in parallel, e.g., simultaneously, or sequentially. When scanning, on or more of layers of the electrical circuit layout, module 710 may be able to detect one or more discontinuities in one or more of the layers, and to define one or more geometrical events within the electrical circuit layout, e.g., based on the detected discontinuities, as described below.

For example, module 710 may scan layers M5, M7 and M9 in the x-direction, e.g., from the left to the right, and identify a first discontinuity at a point 332 of signal line 322.

This may be, for example, the location of a via to another circuit layer. Other types of discontinuities may also exist. Module 710 may also identify a second discontinuity at a point 334 of signal line 322. Similarly, third and fourth discontinuities may be identified at points 336 and 338, respectively. Module 710 may use the identified discontinuities to define geometrical events 202, 204, 206, 208 and 210. Geometrical events 202, 204, 206, 208 and/or 210 may have a substantially uniform configuration of signal and power lines in the x-direction. In the exemplary embodiment of FIGS. 2, 4, 5 and 6, there are no discontinuities within the interconnects of layers M9, M5, M8 and M6. If there were, however, discontinuities at the interconnects of layers M9, M5, M8 and M6, additional geometrical events may be defined to take these discontinuities into account.

Refereeing back to FIG. 8, the method of modeling the electrical circuit layout may also include selecting a geometrical event to be evaluated ("the currently evaluated geometrical event"), as indicated at block 804. For example, module 710 (FIG. 7) may select to evaluate geometrical event 204, e.g., after evaluating a previous geometrical event ("the previously evaluated geometrical event"), e.g., geometrical event 202. According to some exemplary embodiments, module 710 may evaluate one or more of the geometrical events separately. Module 710 may be able to evaluate the geometrical events in parallel, in series, or in a combination of serial and parallel evaluation, e.g., two at a time.

As indicated at block 806, the method may also include designating one of the signal line segments within the currently evaluated geometrical event as a "victim segment". For example, module 710 (FIG. 7) may designate a segment 227 (FIG. 2) of signal line 226 (FIG. 2) as a victim segment.

Figure 2:
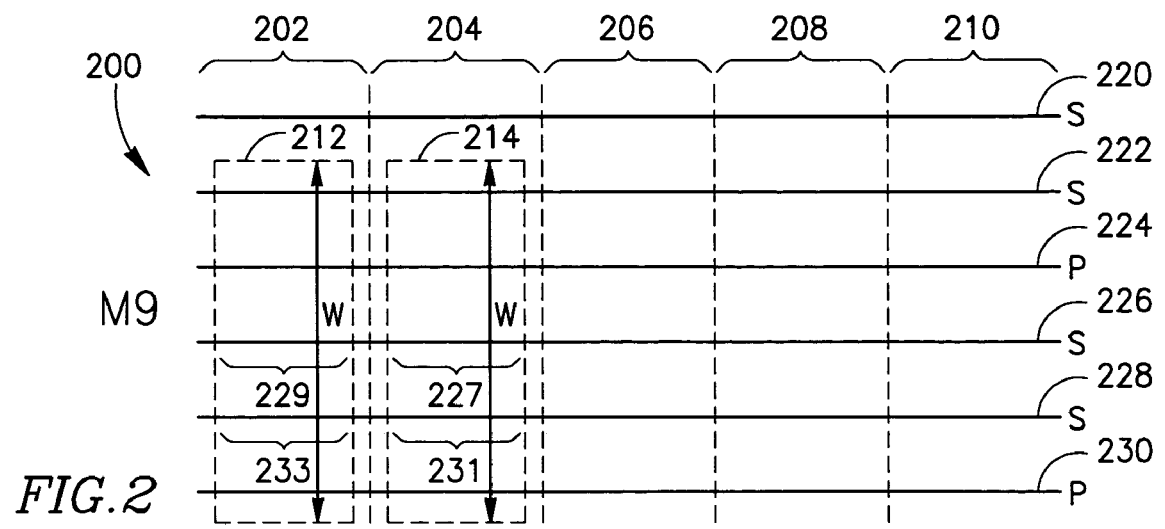
FIGS. 2-6 are conceptual illustrations of five, respective, layers of an electrical circuit layout in accordance with some exemplary embodiments of the present invention.
Figure 3:
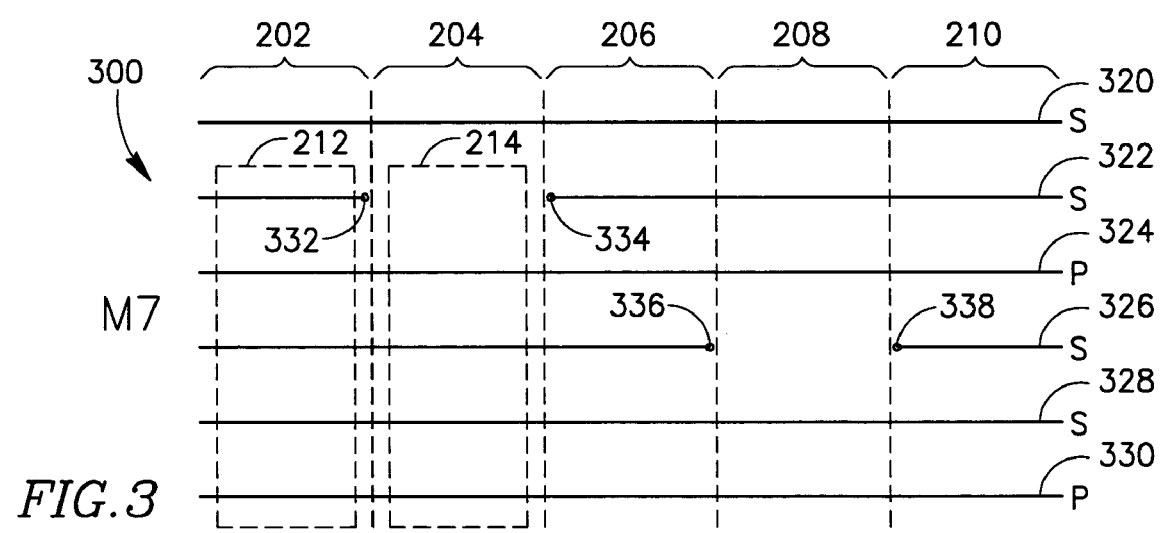
Figure 4:
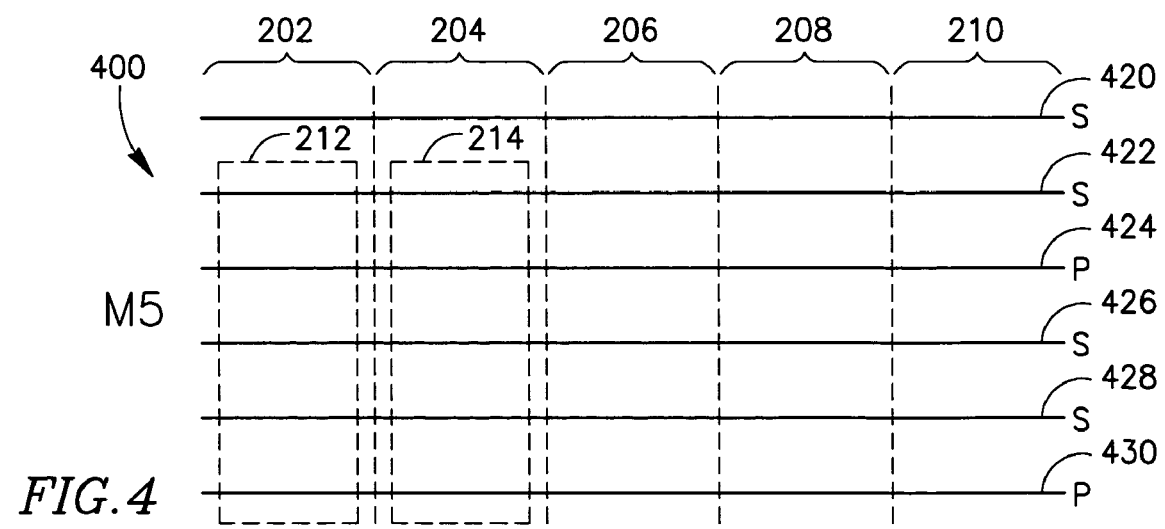
Figure 5:
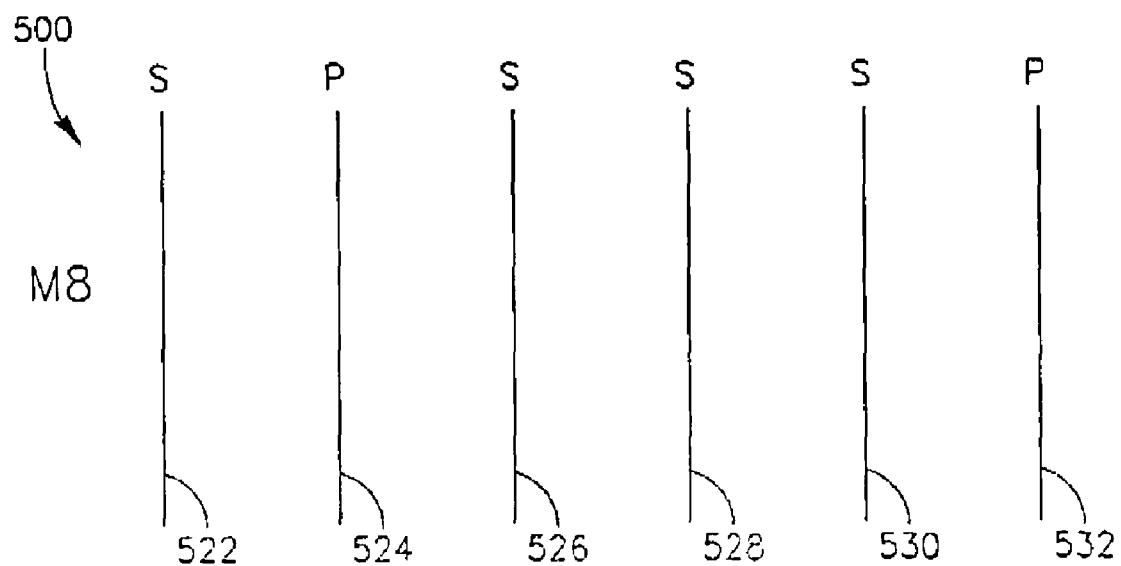

As indicated at block 807, the method may also include defining an interaction window of a predetermined width w around the designated victim. According to some exemplary embodiments of the invention, the width w may be received by module 710 (FIG. 7), e.g., from user file 740 (FIG. 7), and may be, for example, representative of an expected area of inductive interaction of the designated victim segment. For example, module 710 (FIG. 7) may define an interaction window 214 (FIG. 2) around victim segment 227 (FIG. 2).

According to some exemplary embodiments of the invention, the mutual inductance value corresponding to two interconnect segments and/or the self-inductance of an interconnect segment may be approximately linearly dependent on the length of the interconnect segment.

Accordingly, the self inductance of the designated victim segment may be determined based on the self inductance of a previously designated victim segment of the previously evaluated geometrical event, e.g., if the currently evaluated and the previously evaluated geometrical events have a similar configuration of power lines. For example, module 710 (FIG. 7) may determine the self inductance of victim segment 227 (FIG. 2) based on the self inductance of a victim segment 229 (FIG. 2) of previously evaluated geometrical event 202 (FIG. 2), e.g., since geometrical events 202 and 204 (FIG. 2) have a generally similar configuration of power lines. The self inductance of the victim segment may be determined, for example, using the following equation:

$$SI_C = SI_P * l_C / l_P \qquad (1)$$

wherein $SI_C$ and $SI_P$ denote the self-inductances of the victim segments of the currently and previously evaluated geometrical events, respectively; and $l_C$ and $l_P$ denote the lengths of the currently designated and previously designated victim segments, respectively.

Furthermore, the mutual inductance value corresponding to the designated victim and designated attacker segments may be determined based on the mutual inductance value corresponding to previously designated victim and attacker segments of the previously evaluated geometrical event, e.g., if the currently designated victim and attacker segments have a configuration similar to the configuration of the previous victim and attacker segments. For example, module 710 (FIG. 7) may determine the mutual inductance value corresponding to victim segment 227 (FIG. 2) and attacker segment 231 (FIG. 2) based on a previously calculated mutual inductance value corresponding to victim segment 229 (FIG. 2) and attacker segment 233 (FIG. 2) of previously evaluated geometrical event 202 (FIG. 2), e.g., since segments 227 and 231 have a configuration similar to the configuration of segments 229 and 233. The mutual inductance value corresponding to victim and attacker segments of the currently evaluated geometrical event may be determined, for example, using the following equation:

$$MI_{CV/CA} = MI_{PV/PA} * l_C / l_P \qquad (2)$$

wherein $MI_{CV/CA}$ and $MI_{PV/PA}$ denote the mutual inductance value corresponding to the currently designated victim and attacker segments, and the mutual inductance value corresponding to the previously designated victim and attacker segments, respectively.

Thus, as indicated at block 808, the method may include comparing the configuration, e.g., the power line and/or signal line configuration, of the currently evaluated geometrical event to the configuration of a previously evaluated geometrical event.

As indicated at block 810, the method may also include determining the mutual inductance value corresponding to the designated victim segment and/or the self-inductance of the designated victim segment based on previously calculated self-inductance and/or mutual inductance values. For example, the self-inductance of the designated victim segment may be determined based on the self-inductance of a previously designated victim segment, e.g., segment 229 (FIG. 2), in the previously evaluated geometrical event, e.g., using Equation 1, for example, if the currently evaluated and previously evaluated geometrical events have substantially the same power line configuration. The mutual inductance value corresponding to the designated victim and attacker segments, e.g., segments 227 and 232 (FIG. 2), may be determined based on the mutual inductance value corresponding to the victim and attacker segments, e.g., segments 229 and 233 (FIG. 2), of the previously evaluated geometrical event, e.g., using Equation 2, for example, if the designated victim and attacker segments have a configuration similar to the configuration of victim and attacker segments of the previously evaluated geometrical event.

As indicated at block 818, the method may also include determining the self-inductance of the designated attacker segment and/or the mutual inductance value corresponding to the designated victim and attacker segments using a mutual inductance calculation algorithm, e.g., as described below. For example, module 710 (FIG. 7) may provide calculator 715 (FIG. 7) with data relating to the designated victim and attacker segments, and one or more return segments within the interaction window. Calculator 715 (FIG. 7) may calculate the self-inductance of the designated victim segment and/or the mutual inductance value corresponding to the victim and attacker segments, e.g., using the mutual inductance calculation algorithm, as described below, and provide module 710 (FIG. 7) with an evaluated self-inductance of the designated victim segment and/or an evaluated mutual inductance value corresponding to the victim and attacker segments.

As indicated at block 820, determining the mutual inductance value corresponding to the designated victim and attacker segments may include performing a non-adaptive filamentation of a cross section of the designated victim segment, the designated attacker segment, and/or one or more return segments within the interaction window, as described below.

According to some exemplary embodiments of the invention, the width and/or thickness of one or more interconnects of the analyzed electrical circuit layout may be relatively small, e.g., on the order of a dimension defined by a "skin depth", $\delta$, of the interconnect. The skin depth of the interconnect may be defined, for example, as the depth at which the current is smaller by a factor of about the natural logarithm base, e, compared to the current on the surface of the interconnect segment.

According to exemplary embodiments of the invention, a cross-section of an interconnect segment, e.g., the designated victim segment, the designated attacker segment, and/or one or more return segments, may be non-adaptively divided into one or more filaments, e.g., based on predetermined criteria. The predetermined criteria may be based, for example, on a desired ratio between the number of filaments, and either or both the width and thickness of the interconnect segment, e.g., expressed in terms of the skin depth $\delta$. For example, the interconnect segment may be divided into n filaments, such that n is approximately twice the ratio between the width of the interconnect segment and the skin depth $\delta$. As another example, the interconnect segment may be divided into eight filaments, e.g., if the width of the interconnect segment is 2.5 micrometers, and the skin depth of the interconnect segment is 0.6 micrometers.

According to some exemplary embodiments of the invention, the designated victim may be divided into a determined number, $n_V$, of filaments, the designated attacker may be divided into a determined number, $n_A$, of filaments, and the one or more return segments may be divided into a determined number, $n_R$, of filaments e.g., by performing a non-adaptive filamentation, as described above. Thus, the designated victim and attacker segments and the one or more return segments may be divided into a total of $N=n_V+n_A+n_R$ filaments.

Thus, according to some exemplary embodiments of the invention, the filamentation performed on the interconnect segment, e.g., the victim, attacker, and/or return segments, may be a non-adaptive filamentation, i.e., the interconnect segment may be divided e.g., only once, into filaments based on the predetermined criteria, as described above.

As indicated at block 821, according to exemplary embodiments of the invention, determining the mutual inductance value corresponding to the designated victim and attacker segments may also include determining a partial inductance matrix, $[L_p]$, corresponding to the victim and attacker segments, for example, using any suitable calculation method, e.g., as is known in the art. The matrix $[L_p]$ may include for example an N×N matrix. For example, the matrix $[L_p]$ may be determined using a two-dimensional approximation for inductance between two parallel rectangular conductors. For example, one or more elements of the matrix $[L_p]$ may be determined using an analytical 2D approximation, e.g., as described below.

According to some exemplary embodiments of the invention, an analytical 2D approximation of a mutual inductance value corresponding to two conductor elements may be derived, e.g., from an inductance formula corresponding to first and second rectangular conductors having substantially the same length, denoted $l_i$. For example, a Taylor series may be applied to the inductance formula assuming the length $l_i$ is much larger than the width $w_1$ of the first conductor, the width $w_2$ of the second conductor, the height $h_1$ of the first conductor, the height $h_2$ of the second conductor, the distance $d_x$ in a first direction between the conductors, and the distance $d_y$ in a second direction between the conductors. Thus, for example, the mutual inductance value, denoted $L^p_{12}(w_1,w_2,h_1,h_2,d_x,d_y)$, corresponding to the two conductors may be approximated by the following equation:

$$L^p_{12}(w_1, w_2, h_1, h_2, d_x, d_y) = \qquad (3)$$
$$0.002 l_i (w_1 \cdot w_2 \cdot h_1 \cdot h_2) \cdot \left[ [M1(x, y) - M0(x, y)] \begin{matrix} d_x, d_x+w_1+w_2 \\ (x) \\ d_x+w_1, d_x+w_2 \end{matrix} \right]$$
$$\begin{matrix} d_y, d_y+h_1+h_2 \\ (x) \\ d_y+h_1, d_y+h_2 \end{matrix}$$

wherein:

$$\left[ [f(x, y)] \begin{matrix} x_1, x_3 \\ (x) \\ x_2, x_4 \end{matrix} \begin{matrix} y_1, y_3 \\ (y) \\ y_2, y_4 \end{matrix} \right] = \sum_{i,j=1}^{4} ((-1)^{i+j+1} \cdot f(x_i, y_i)) \qquad (4)$$

$$M0(x, y) = -xy^4/24 \cdot \ln\left(\frac{x+\sqrt{x^2+y^2}}{|y|}\right) - \qquad (5)$$
$$x^4y/24 \cdot \ln\left(\frac{y+\sqrt{x^2+y^2}}{|x|}\right) + (x^4+y^4-3x^2y^2) \cdot \sqrt{x^2+y^2}/60$$

$$M1(x, y) = 7x^2y^2l_i/16 - \qquad (6)$$
$$(x^2y^2/4 - x^4/24 - y^4/24)l_i \cdot \ln\left(\sqrt{x^2+y^2}\right) + x^2y^2/4 \cdot l_i \cdot \ln(2l_i) -$$
$$x^2y^2l_i/6 - xy^3l_i \cdot ATAN(x/y) - x^3yl_i/6 \cdot ATAN(y/x)$$

According to some exemplary embodiments of he invention, the self inductance value corresponding to a conductor element may be approximated by substituting $w_1=w_2$, $h_1=h_2$, $d_x=-w$, and $d_y=-h$ in Equation 3.

As indicated at block 822, according to exemplary embodiments of the invention, determining the mutual inductance value corresponding to the designated victim and attacker segments may also include determining a partial resistance matrix, $[R_p]$, corresponding to the victim and attacker segments, for example, using any suitable calculation method, e.g., as is known in the art. The matrix $[R_p]$ may include for example an N×N matrix. For example, the matrix $[R_p]$ may be determined using a DC approximation for resistance of a rectangular conductor, as is known in the art.

As indicated at block 823, according to exemplary embodiments of the invention, determining the mutual inductance value corresponding to the designated victim and attacker segments may further include determining a partial impedance matrix, $[Z_p]$, corresponding to the N filaments, for example, using any suitable algorithm, e.g., as is known in the art. The matrix $[Z_p]$ may include for example an N×N symmetrical matrix. The matrix $[Z_p]$ may be determined, for example, using the following equation in complex representation:

$$[Z_p]=[R_p]+jw[L_p] \qquad (7)$$

wherein w denotes a parameter related to a determined extraction frequency, e.g., an angular frequency, which may be calculated from the extraction frequency multiplied by 2π, as is known in the art.

As indicated at block 824, according to exemplary embodiments of the invention, determining the mutual inductance value corresponding to the designated victim and attacker segments may also include determining an effective partial impedance matrix, $[Z'_p]$, and a loop impedance matrix, $[Z'_s]$, for example, using any suitable algorithm, e.g., as is known in the art. For example, the matrices $[Z'_s]$ and/or $[Z'_p]$ may be determined based on the attacker segment filaments and/or the victim segment filaments; the distribution of the returns within the interaction window surrounding the victim segment; and/or one or more predefined boundary conditions, e.g., as is known in the art.

For example, the matrix $[Z'_p]$ may be determined using the following equation:

$$[Z'_p]=([P]^T[Z_p]^{-1}[P])^{-1} \qquad (8)$$

wherein [p] denotes a transformation matrix, which may be de determined, for example, based on a boundary condition that all the filaments within a conductor will have the same potential drop along its length, e.g., as known in the art.

For example, the matrix $[Z'_s]$ may be determined using the following equation:

$$[Z'_s]=([P']^T[Z'_p][P']) \qquad (9)$$

wherein [p'] denotes a transformation matrix, which may be de determined, for example, based on a boundary condition that all current return paths are formed by the Vcc/Vss power grid returns, e.g., as is known in the art.

According to some exemplary embodiments of the invention, the matrix $[Z'_s]$ may include values corresponding to the self-inductance of the victim and/or the mutual inductance value corresponding to the designated victim segment and the designated attacker segment. For example, inductance calculator 715 (FIG. 7) may be able to calculate the loop impedance matrix $[Z'_s]$ using Equation 9, e.g., based on data corresponding to the designated victim and attacker segments and the return segments, e.g., received from module 710 (FIG. 7).

As indicated at block 826, determining the mutual inductance value corresponding to the designated victim and attacker segments may include applying a Cholesky decomposition, e.g., as is known in the art, to a matrix including data corresponding to the designated victim segment, the designated attacker segment, and/or the one or more return segments. For example, the method may include applying the Cholesky decomposition to the partial impedance matrix $[Z_p]$, e.g., to determine an inverse matrix, $[Z_p]^{-1}$, of matrix $[Z_p]$. Additionally or alternatively, the method may include applying the Cholesky decomposition to the matrix $[P]^T [Z_p]^{-1}[P]$, e.g., to determine inverse matrix $([P]^T[Z_p]^{-1}[P])^{-1}$.

As indicated at block 827, according to some exemplary embodiments of the invention, applying the Cholesky decomposition to the matrix may include arranging the rows of the matrix, e.g., such that one or more upper rows of the matrix include data corresponding to the return segments.

According to some exemplary embodiments of the invention, the values of the return segments within the interaction window may be the same for one or more pairs of victim and attacker segments within the interaction window. It will be appreciated by those skilled in the art, that the computations required for applying a Cholesky decomposition to a matrix may be reduced if the values of one or more upper rows of the matrix are equal to the values of a previous matrix to which a Cholesky decomposition has been previously applied. Thus, arranging the rows of the matrix such that one or more upper rows of the matrix include data corresponding to the return segments may reduce the computations required for applying the Cholesky decomposition to the matrix.

As indicated at block 828, the method may further include determining whether or not there are more signal line segments within the interaction window to be designated as attacker segments. According to some exemplary embodiments of the invention, one or more of the other signal line segments, i.e., except for the designated victim segment, within the interaction window may be designated, e.g., by module 710 (FIG. 7) as an attacker segment. According to other exemplary embodiments of the invention only some of the other signals line segments may be designated as attacker segments. For example, module 710 (FIG. 7) may be able to identify all the power line segments within the interaction window, and to designate all signal line segments within the interaction window, which are bounded by the identified power segments as attacker segments.

According to exemplary embodiments of the invention, the method may include repeating designating another attacker within the interaction window, e.g., if the designated attacker is determined, e.g., by module 710 (FIG. 7), not to be the last attacker segment within the interaction window.

As indicated at block 830, the method may further include determining whether or not there are more geometrical events to be analyzed. For example, module 710 (FIG. 7) may determine whether the currently evaluated geometrical event is the last geometrical event to be evaluated within the electrical circuit layout.

According to exemplary embodiments of the invention, the method may include repeating selecting a geometrical event to be evaluated, e.g., if the currently evaluated geometrical event is determined, e.g., by module 710 (FIG. 7), not to be the last geometrical event to be evaluated within the electrical circuit layout.

As indicated at block 832, the method may further include combining the determined self-inductances and/or mutual inductances, e.g., to generate resistance-inductance-capacitance (RLC) data corresponding to the analyzed electrical circuit layout.

According to some exemplary embodiments of the invention a process for determining the self inductance of the designated victim, e.g., as indicated at block 809, and determining the mutual inductance value corresponding to the designated victim and attacker segments, e.g., as indicated at block 813, may be expressed by an exemplary pseudo code as follows:

```
Foreach (net as victim) do
{
    Include all Vcc/Vss return paths in geometry
    Include victim in geometry
    Calculate partial inductance matrix for victim and all possible
    returns and
            store the matrix
    Foreach (net as attacker in window) do
    {
        Include attacker in geometry
        Calculate 2×2 inductance matrix by using
            1. Non-adaptive filamentation as a function of:
```

-continued

```
            i. Width and thickness of interconnect
            ii. Skin depth
         2. Cholesky decomposition (in place of iterative
            solver)
         Reuse the fixed interaction matrix between victim and
            all returns
         Remove entry of interest for particular attacker
      }
      Assemble a column of the matrix description to give all inductive
            interactions with victim
}
``` wherein, the 2×2 inductance matrix may include, for example, the following matrix:

$$\begin{bmatrix} L_{vv} & L_{va} \\ L_{av} & L_{aa} \end{bmatrix} \quad (10)$$

wherein $L_{vv}$ and $L_{aa}$ denote the self inductance of the victim and the attacker segments, respectively; and $L_{va}$ and $L_{av}$, denote the mutual inductance value corresponding to the victim and attacker segments and the mutual inductance value corresponding to the attacker and victim segments, respectively.

Such pseudo code may be expressed in various languages, circuits or firmware structures. Further, other instructions, series of instructions or algorithms may be used, and other embodiments may perform other specific sets of operations and implement other specific algorithms.

According to an exemplary embodiment of the invention, one or more processes of the above described method may be applied to an exemplary electrical circuit cross-section having interconnects distributed in two layers, M3 and M5, at an extraction frequency of 14 GHz, as follows:

TABLE 1

| Metal Layer | Num. Signals | Num. returns | Signal width (microns) | Return width (microns) |
| --- | --- | --- | --- | --- |
| M3 | 69 | 32 | 0.18 | 0.58 |
| M5 | 22 | 15 | 0.34 | 2.5 |

The following table includes a comparison between the required time for evaluating the inductance of the electrical circuit cross-section of Table 1 using first, second and third modeling methods:

TABLE 2

| Method No. | Extraction | Filamentation | Time (seconds) |
| --- | --- | --- | --- |
| 1 | Full | Adaptive | 187.6 |
| 2 | Pair based | Adaptive | 58.5 |
| 3 | Pair Based | Non-Adaptive | 3.4 |

The first modeling method includes a conventional electromagnetic modeling algorithm implementing a full inductance extraction, and adaptive filamentation. The second modeling method includes an inductance evaluation algorithm, according to one exemplary embodiment of the invention, implementing pair-based extraction, and adaptive filamentation, e.g., as described above. The third modeling method includes an inductance evaluation algorithm, according to another exemplary embodiment of the invention, implementing pair-based extraction and a non-adaptive filamentation, e.g., as described above.

As reflected in Table 2, the time for evaluating the inductance of the electrical circuit using the first modeling method may be more than three times longer than the time for evaluating the inductance of the electrical circuit using the second modeling method. Furthermore, the time for evaluating the inductance of the electrical circuit using the first modeling method may be more than fifty times longer than the time for evaluating the inductance of the electrical circuit using the third modeling method.

Figure 9:
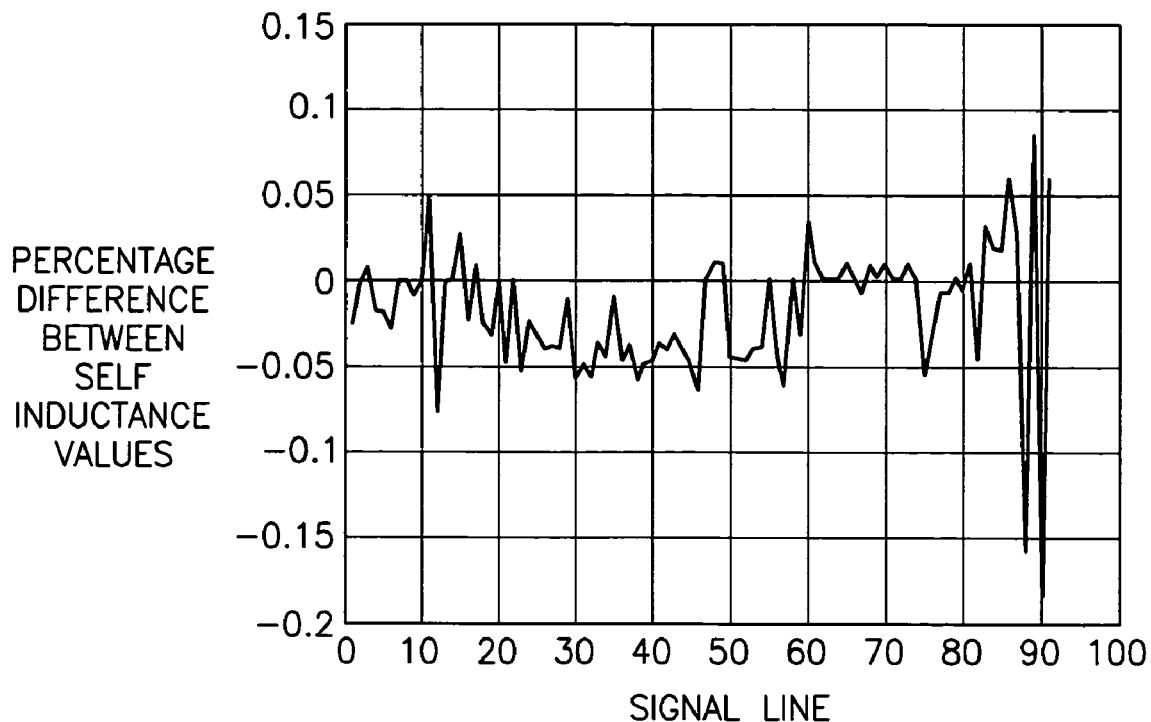
FIG. 9 is a schematic illustration of a graph depicting the percentage difference between self-inductance values evaluated using the modeling method of FIG. 8 and self-inductance values evaluated using a conventional modeling method.
Figure 10:
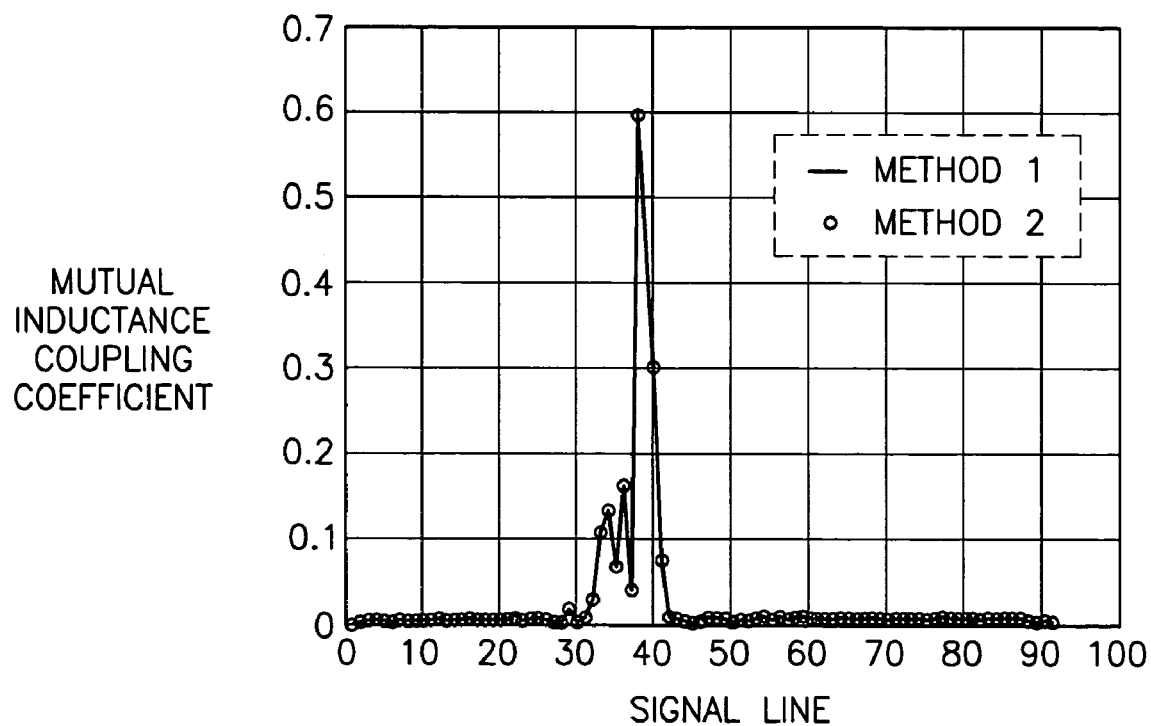
FIG. 10 is a schematic illustration of a graph depicting the mutual inductive coupling coefficients evaluated using the modeling method of FIG. 8 as compared to the mutual inductive coupling coefficients evaluated using a conventional modeling method.

Reference is made to FIG. 9, which schematically illustrates a graph depicting the percentage difference between the self-inductance of the signal lines of the cross section of Table 1 evaluated using the first and second modeling methods. Reference is also made to FIG. 10, which schematically illustrates a graph depicting the mutual inductive coupling coefficients evaluated using the first and second modeling methods, respectively.

It will be appreciated that the self-inductance values and the mutual inductive coupling coefficient evaluated using the second modeling method may be approximately equal to the mutual inductive coupling coefficient evaluated using the first modeling method.

Embodiments of the present invention may be implemented by software, by hardware, or by any combination of software and/or hardware as may be suitable for specific applications or in accordance with specific design requirements. Embodiments of the present invention may include units and sub-units, which may be separate of each other or combined together, in whole or in part, and may be implemented using specific, multi-purpose or general processors, or devices as are known in the art. Some embodiments of the present invention may include buffers, registers, storage units and/or memory units, for temporary or long-term storage of data and/or in order to facilitate the operation of a specific embodiment.

While certain features of the invention have been illustrated and described herein, many modifications, substitutions, changes, and equivalents may occur to those of ordinary skill in the art. It is, therefore, to be understood that the appended claims are intended to cover all such modifications and changes as fall within the true spirit of the invention.

What is claimed is:

1. A method for calculating inductance in an electric configuration comprising:
   receiving data related to said electric configuration: and
   calculating, based on said data, a plurality of two-dimensional mutual inductance values corresponding to a designated victim segment within a geometrical event and a plurality of designated attacker segments, respectively, wherein calculating said mutual inductance values comprises calculating at least one of said mutual inductance values based on one or more previous mutual inductance values of a previous geometrical event.

2. The method of claim 1, wherein said one or more previous mutual inductance values comprise one or more mutual inductance values corresponding to a previous victim segment and one or more previous attacker segments within said previous geometrical event respectively.

3. The method of claim 2, wherein calculating said mutual inductance values based on said one or more previous mutual inductance values comprises applying to said one or more previous mutual inductance values a predetermined function.

4. The method of claim 3, wherein said predetermined function comprises a linear function.

5. The method of claim 1, wherein calculating said mutual inductance values comprises performing non-adaptive filamentation of at least one filamented segment, wherein said filamented segment is said designated victim segment, one of said plurality of designated attacker segments, or a return segment.

6. The method of claim 5, wherein performing said non-adaptive filamentation comprises dividing said filamented segment into one or more filaments based on one or more predetermined criteria.

7. The method of claim 1, wherein calculating said plurality of mutual inductance values comprises calculating said plurality of mutual inductance values separately.

8. The method of claim 1 comprising dividing a circuit layout into a plurality of geometrical events, one or more of which events including a substantially uniform signal and power configuration in a predetermined direction.

9. The method of claim 1 comprising designating said plurality of attackers within a predefined window around said designated victim.

10. The method of claim 1 comprising calculating a self-inductance of said designated victim.

11. The method of claim 1 comprising repeating said calculating for another designated victim within said geometrical event.

12. A method for calculating inductance in an electric configuration comprising:
receiving data related to said electric configuration; and
calculating, based on said data, a plurality of two-dimensional mutual inductance values corresponding to a designated victim segment within a geometrical event and a plurality of designated attacker segments, respectively,
wherein calculating said mutual inductance values comprises performing non-adaptive filamentation of at least one filamented segment by dividing said filamented segment into one or more filaments based on a relation between a skin depth of said filamented segment and a dimension of said filamented segment, said filamented segment is said designated victim segment, one of said plurality of designated attacker segments, or a return segment.

13. The method of claim 12, wherein said dimension comprises a width of said filamented segment or a thickness of said filamented segment.

14. A method for calculating inductance in an electric configuration comprising:
receiving data related to said electric configuration; and
calculating a plurality of two-dimensional mutual inductance values corresponding to a designated victim segment within a geometrical event and a plurality of designated attacker segments, respectively; wherein calculating said mutual inductance values comprises applying a cholesky decomposition to a matrix including data corresponding to said designated victim segment, one of said designated attacker segments, and one or more return segments within said geometrical event.

15. The method of claim 14, wherein said matrix comprises a partial impedance matrix.

16. The method of claim 14, wherein applying said cholesky decomposition comprises arranging said matrix such that one or more upper rows of said matrix include data corresponding to said one or more return segments.

17. An apparatus for calculating inductance in an electric configuration comprising:
an inductance modeling arrangement able to receive data related to said electric configuration and to calculate, based on said data, a plurality of two-dimensional mutual inductance values corresponding to a designated victim segment within a geometrical event and a plurality of designated attacker segments, respectively, wherein said inductance modeling arrangement is able to determine one or more of said mutual inductance values based on one or more previous mutual inductance values of a previous geometrical event.

18. The apparatus of claim 17, wherein said inductance modeling arrangement comprises an extraction module able to divide a circuit layout into a plurality of geometrical events, one or more of which events including a substantially uniform signal and power configuration in a predetermined direction.

19. The apparatus of claim 18, wherein said extraction module is able to designate said plurality of attackers within a predefined window around said designated victim.

20. The apparatus of claim 18, wherein said extraction module is able to repeat said determining for another designated victim within said geometrical event.

21. The apparatus of claim 18, wherein said inductance modeling arrangement comprises a calculator, wherein said extraction module is able to provide said calculator with data corresponding to said designated victim segment and one of said plurality of designated attacker segments, and wherein said calculator is able to evaluate the two-dimensional mutual inductance value corresponding to said designated victim segment and the designated attacker segment provided by said extraction module.

22. The apparatus of claim 21, wherein said calculator is able to perform non-adaptive filamentation of one or more of said designated victim segment, the designated attacker segment provided by said extraction module, and one or more return segments.

23. The apparatus of claim 21, wherein said calculator is able to apply a cholesky decomposition to a matrix including data corresponding to said designated victim segment, the designated attacker segment provided by said extraction module, and one or more return segments.

24. The apparatus of claim 17, wherein said previous mutual inductance values comprise one or more mutual inductance values corresponding to a previous victim segment and one or more previous attacker segments within said previous geometrical event respectively.

25. The apparatus of claim 24, wherein said extraction module is able to apply to said previous mutual inductance values a predetermined function.

26. A program storage device having instructions readable by a machine that when executed by the machine result in:
receiving data related to an electric configuration; and
calculating, based on said data, a plurality of two-dimensional mutual inductance values corresponding to a designated victim segment within a geometrical event and a plurality of designated attacker segments, respectively,
wherein the instructions resulting in calculating said mutual inductance values comprise instructions resulting in calculating at least one of said mutual inductance values based on one or more previous mutual inductance values of a previous geometrical event.

27. The program storage device of claim 26, wherein the instructions resulting in calculating said mutual inductance values comprise instructions resulting in performing non-adaptive filamentation of at least one of said designated victim segment, said plurality of designated attacker segments, an one or more return segments.

28. A program storage device having instructions readable by a machine that when executed by the machine result in:
receiving data related to an electric configuration; and
calculating, based on said data, a plurality of two-dimensional mutual inductance values wherein said mutual inductance values corresponding to a designated victim segment within a geometrical event and a plurality of designated attacker segments, respectively,
wherein the instructions resulting in determining said mutual inductance values comprise instructions resulting in applying a cholesky decomposition to a matrix including data corresponding to said designated victim segment, one of said designated attacker segments, and one or more return segments within said geometrical event.

29. A system for calculating inductance in an electric configuration comprising:
a memory to store layout data of an electrical configuration; and
a processor able to receive layout data and calculate, based on said layout data, a plurality of two-dimensional mutual inductance values corresponding to a designated victim segment within a geometrical event and a plurality of designated attacker segments, respectively,
wherein said processor is able to apply a cholesky decomposition to a matrix including data corresponding to said designated victim segment, one or more of said plurality of designated attacker segments, and one or more return segments.

30. The system of claim 29, wherein said processor is able to perform non-adaptive filamentation of one or more of said designated victim segment, one or more of said plurality of designated attacker segments, and one or more return segments.

31. The system of claim 29, wherein said processor is able to divide said electrical configuration into a plurality of geometrical events, one or more of which events including a substantially uniform signal and power configuration in a predetermined direction.

* * * * *